United States Patent [19]

Luthra et al.

[11] Patent Number: 4,825,379
[45] Date of Patent: Apr. 25, 1989

[54] METHOD AND APPARATUS FOR PROCESSING WAVEFORM RECORDS FOR JITTER ELIMINATION PRIOR TO AVERAGING IN DETERMINING SIGNAL TO NOISE RATIO

[75] Inventors: Ajay K. Luthra, Beaverton; Yih-Chyun Jenq, Lake Oswego, both of Oreg.

[73] Assignee: Tektronix, Inc., Beaverton, Oreg.

[21] Appl. No.: 901,668

[22] Filed: Aug. 29, 1986

[51] Int. Cl.⁴ .................................... G01R 25/00
[52] U.S. Cl. .......................... 364/487; 324/83 R; 364/575; 364/734; 358/339
[58] Field of Search ............ 364/487, 571, 417, 575, 364/734, 483; 324/77 G, 77 H, 77 R, 83 R, 83 D, 121 R, 113; 360/36.1, 26, 32; 375/118; 358/339, 155; 371/1, 71

[56] References Cited

U.S. PATENT DOCUMENTS

| | | | |
|---|---|---|---|
| 3,446,949 | 5/1969 | Trimble | 364/734 |
| 3,504,164 | 3/1970 | Farrell et al. | 364/487 |
| 3,557,354 | 1/1971 | Trimble | 324/77 R |
| 3,940,692 | 2/1976 | Neilson | 324/77 R |
| 4,170,992 | 10/1979 | Dillman | 364/417 |
| 4,352,094 | 9/1982 | Reneric | 364/575 X |
| 4,505,512 | 4/1970 | Fricke, Jr. et al. | 364/858 |
| 4,540,982 | 9/1985 | Jalovec | 324/121 R |
| 4,555,765 | 11/1985 | Crooke et al. | 364/487 |
| 4,628,254 | 12/1986 | Bristol | 324/121 R |

OTHER PUBLICATIONS

"Calibrated Real-Time Signal Averaging", Deardorff et al. Hewlett-Packard Journal, Apr. 1968, pp. 8–13.
"What is Signal Averaging?" by Charles R. Trimble, Hewlett-Packard Journal 4/68 pp. 2–7.

Primary Examiner—Parshotam S. Lall
Assistant Examiner—S. A. Melnick
Attorney, Agent, or Firm—John Smith-Hill; Robert S. Hulse

[57] ABSTRACT

Stored waveform records representative of respective repetitions of a repetitive signal are processed by reading a first waveform record from memory to form a reference signal. A second waveform record is read from memory to form a second signal, and the second signal is shifted in time in such a manner as to minimize the power of a difference signal, of which the instantaneous magnitude is representative of the difference in instantaneous magnitude between the reference signal and the time-shifted second signal. If the waveform records are identical but for jitter, and the power of the difference signal is brought to zero, this implies that the first waveform signal is synchronous with the processed second waveform signal, i.e., there is no jitter between the two signals. If waveform records resulting from the reference signal and the processed second signal are then averaged, the level of noise in the averaged record is reduced relative to the stored records and the averaged record is free of distortion due to jitter.

21 Claims, 3 Drawing Sheets

METHOD AND APPARATUS FOR PROCESSING WAVEFORM RECORDS FOR JITTER ELIMINATION PRIOR TO AVERAGING IN DETERMINING SIGNAL TO NOISE RATIO

This invention relates to a method and apparatus for processing waveform records.

BACKGROUND OF THE INVENTION

It is frequently desired to measure features of a repetitive signal. When the useful signal is embedded in random noise, a number of waveform records representative of respective repetitions of the repetitive signal may be stored, and an averaged waveform may be generated by computing the average of the stored waveform records. If the noise is random, the noise present in the averaged waveform is reduced with respect to the stored waveform records. Therefore, measurements made on the averaged waveform reveal more information about the useful signal than those made on the stored waveform records.

Waveform records are stored by digitizing the repetitive signal and writing the resulting sequence of N digital words per record into memory. A signal is digitized by sampling the signal at a constant clock rate, and quantizing each sample using an analog-to-digital converter. The averaged waveform is generated by averaging the ith words of the stored records for $i=1 \ldots N$. However, if the clock pulses do not occur at precisely the same points within each repetition, the averaged waveform record will be distorted. For example, if only two records were averaged and each contained a ramp of uniform slope and of duration t from a lower voltage level $V_o$ to a higher voltage level $V_o+V$, and the records were identical except that the second repetition was delayed such that the start of the ramp of the second repetition occurred at a time $\Delta t$, relative to a fixed reference point, later than the time at which the start of the ramp of the first repetition occurred, when the records are averaged the slope of the ramp in the averaged waveform is changed from $V/t$ to $V/(t+\Delta t)$. If the two stored waveform records were sinusoidal, the amplitude of the averaged waveform is dependent upon the jitter between the two records.

In the Tektronix 1980 Automatic Video Measurement Set, waveform records representative of respective repetitions of a repetitive segment of a television signal are stored and averaged, and features of the averaged record are measured, for example in order to determine whether the television signal complies with prescribed standards. Jitter among the records is removed using an algorithm known as ALIGN. The ALIGN algorithm is subject to the disadvantage that it does not operate properly if the spectral characteristics of the jitter are not uniform. Also, execution of the ALIGN algorithm is time consuming since it involves three fast-Fourier transformations.

SUMMARY OF THE INVENTION

In a preferred embodiment of the present invention, stored waveform records representative of respective repetitions of a repetitive signal are processed by reading a first waveform record from memory to form a reference signal. A second waveform record is read from memory to form a second signal, and the second signal is shifted in time in such a manner as to minimize the power of a difference signal, of which the instantaneous magnitude is representative of the difference in instantaneous magnitude between the reference signal and the time-shifted second signal.

If the waveform records are identical but for jitter, and the power of the difference signal is brought to zero, this implies that the first waveform signal is synchronous with the processed second waveform signal, i.e., there is no jitter between the two signals. If waveform records resulting from the reference signal and the processed second signal are then averaged, the level of noise in the averaged record is reduced relative to the stored records and the averaged record is free of distortion due to jitter.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 1:
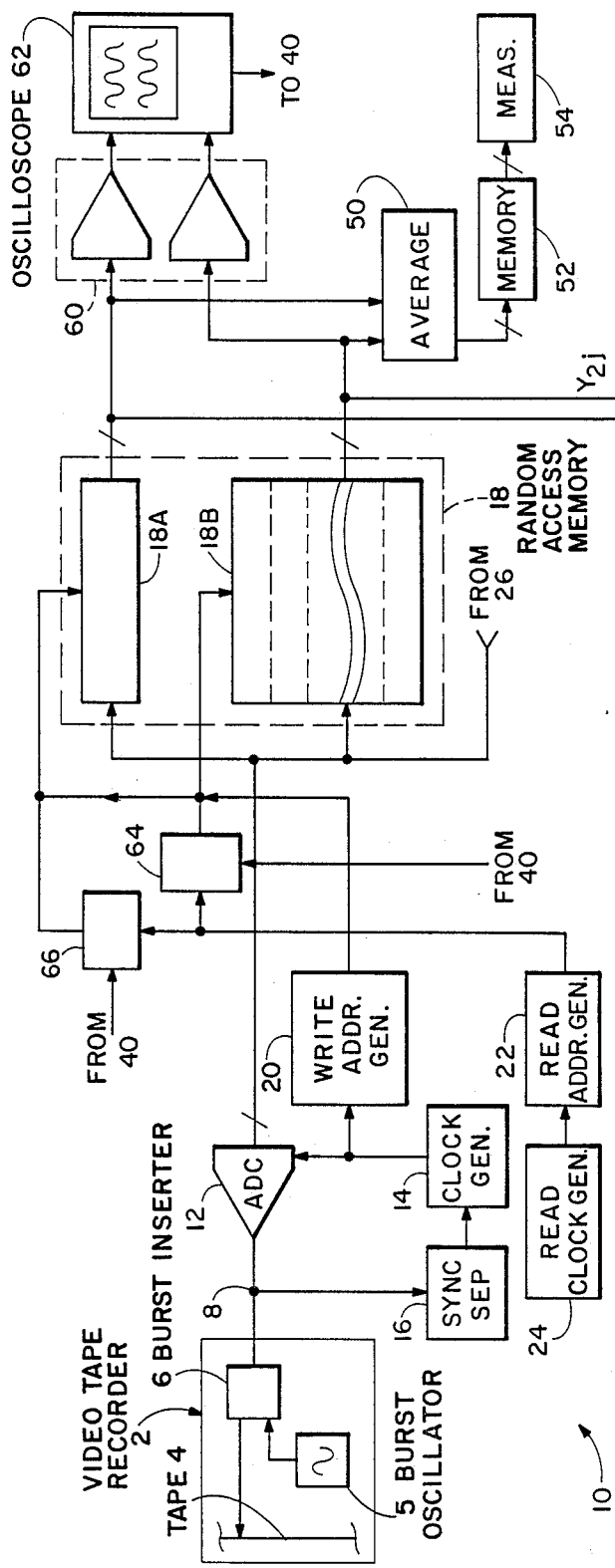
FIG. 1 is a block diagram of apparatus embodying the present invention.
Figure 1:
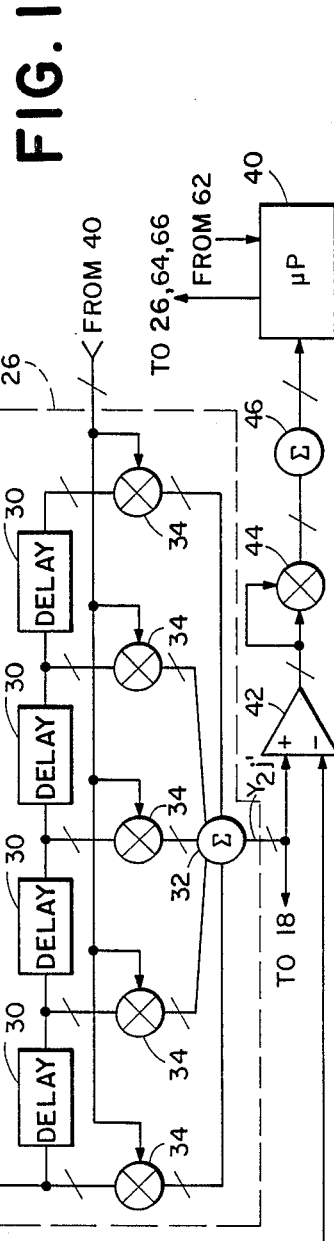

A conventional helical scan video tape recorder (VTR), such as that shown at 2 in FIG. 1, generates a signal in the NTSC format. The signal comprises, on each line of the active picture interval, a horizontal sync pulse, color burst and picture information. The horizontal sync pulse and the picture information are read from the tape 4 by the VTR, but the color burst is generated in an oscillator 5 by a heterodyne process and is inserted into the signal downstream of the VTR's record/playback heads, with the proper timing relative to the horizontal sync pulse, by a burst inserter 6.

In order to identify and diagnose problems in the operation of the VTR, the output terminal of the VTR is connected to the input terminal 8 of a test and measurement device 10, and a pre-recorded videotape is played on the VTR. The tape has the identical test signal recorded on every line. Therefore, the signal received at the terminal 8 is a signal that repeats at line rate, i.e., about 15.75 kHz, and comprises, in each repetition, a horizontal sync pulse, burst and the picture information portion of the test signal. The test and measurement device 10 is used to identify and measure distortions in the test signal that might be due to improper operation of the VTR.

Figure 2:
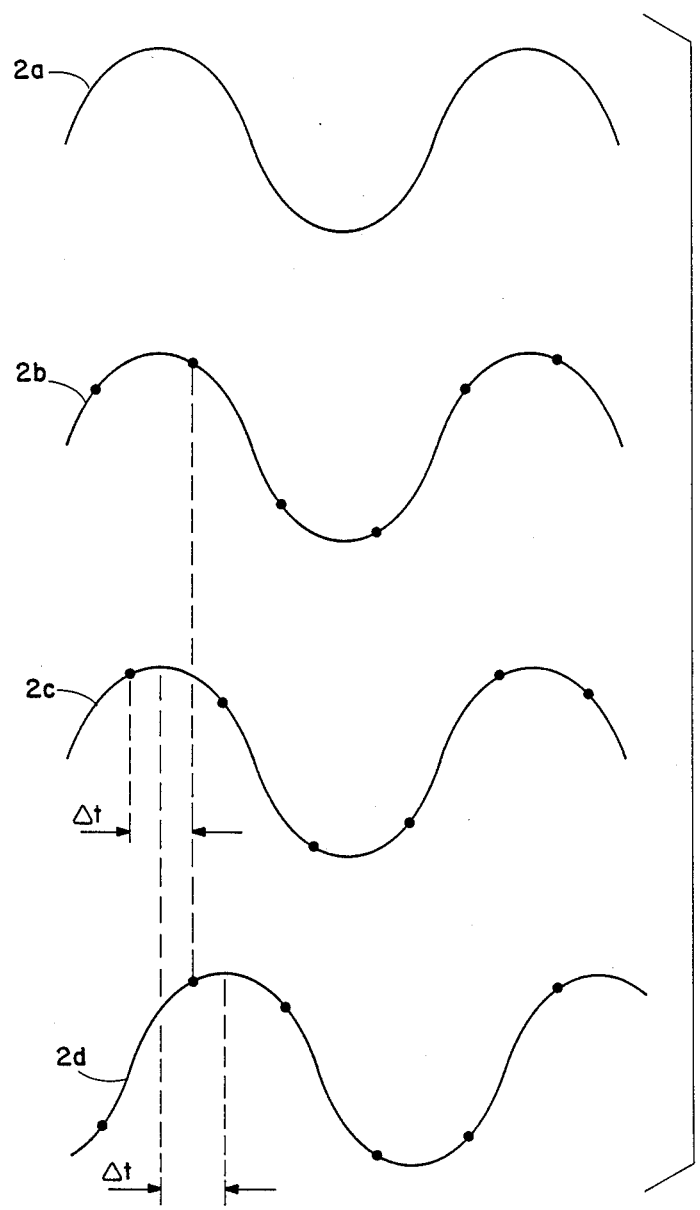
FIG. 2 shows waveforms that will be used to explain the invention.

The repetitive signal received at the terminal 8 of the device 10 is digitized by means of an analog-to-digital converter (ADC) 12 that samples the video signal in response to a sampling clock and quantizes the resulting samples and thus generates a stream of digital words. The sampling clock is generated by a sampling clock generator 14 that is triggered by a horizontal sync separator 16. The digital words are written into a random access memory 18 under control of a write address generator 20, which also receives the sampling clock. Thus, the memory 18 stores a record of n successive repetitions of the test signal that is recorded on the tape 4. The sampling clock is generated at four times subcarrier frequency, and therefore each waveform record contains 910 digital words. It will be assumed for the purpose of this description that the test signal includes a portion at subcarrier frequency. The waveform shown in FIG. 2 illustrates a portion of of the test 2a signal that is at subcarrier frequency and the waveforms 2b and 2c illustrate that same portion of two repetitions and also illustrate the sampling clock times. It will be noted that noise superimposed on the test signal is not shown in FIG. 2.

The phase of the sampling clock relative to the subcarrier portion of the test signal is subject to change from line to line due to random effects in the sync separator 16, the clock generator 14 and the ADC 12. Accordingly, there is relative jitter between the sampling clock and the successive repetitions of the test signal. This jitter is shown in FIG. 2 by the shift $\Delta t$ in time between the sampling clock times for waveform (c) and those of waveform 2b. The effect of this jitter is that when the digital words representing the waveforms 2b and 2c are written into memory and are subsequently read from memory, e.g. for averaging, the waveform 2c is shifted in time relative to the waveform 2b (see waveform 2d).

In order to enable this jitter to be removed, the memory 18 is segregated into two portions, namely a portion 18A that stores a reference waveform record $\{Y_{1i}, i=1 \ldots N\}$ and a portion 18B that stores the other waveform records $\{Y_{qi}, i=1 \ldots N, q=2 \ldots n\}$. The memory portion 18A has 1024 addressable locations, of which only 910 are used to store the reference waveform record $\{Y_{1i}\}$ (In this particular implementation, N is equal to 910.). The memory portion 18B is organized as multiple segments each having 1024 addressable locations. The ten lower address bits for each of the segments of the memory portion 18B are the same as the address bits for the memory portion 18A. It is therefore possible to read the reference record from the memory portion 18A simultaneously with a selected record in the memory portion 18B. The repetition that is used to form the reference record is selected arbitrarily.

When the memory 18 has been loaded with n waveform records, the reference record $\{Y_{1i}\}$ and a selected record, e.g. $\{Y_{2i}\}$, are read synchronously from the memory portion 18A and a segment of the memory portion 18B respectively under control of a read address generator 22, driven by a read clock generator 24. The digital signals are converted to analog form by a digital-to-analog converter (DAC) 60. The resulting analog signals $Y_1$ and $Y_2$ are applied to an oscilloscope 62. The waveforms of the signals generated from the two records are observed, and the waveform $Y_2$ is shifted horizontally relative to the waveform $Y_1$ in order to achieve coarse coincidence (coincidence to within one clock period) between the two waveforms. The amount by which the waveform $Y_2$ is shifted is used by a microprocessor 40 to compute an offset that is applied by an offset circuit 64 to the addresses that are applied to the memory segment 18B by the read address counter 22. When the offset has been computed, the record $\{Y_{2i}\}$ is repeatedly read from memory using the offset addresses, and the successive repetitions are applied to an adaptive FIR (finite impulse response) filter 26. The filter 26 comprises M delay elements 30, a summation circuit 32, M multipliers 34 connected between the outputs of the delay elements and the summation circuit, and a further multiplier connected between the input of the filter 26 and the summation circuit 32. FIG. 1 illustrates M as being equal to four. However, it is preferred that M be rather larger, e.g. eight or ten. The delay elements 30 each impose a delay equal to the period of the read clock. Each multiplier 34p (where p is an integer from 0 to M) multiplies its digital input word by a factor $k_p$ in order to generate an output word that is applied to the summation circuit. The values of $k_p$ are adjustable in dependence upon control signals received from the processor 40.

When the jth (j=M+1 ... N) digital word $Y_{2j}$ of the selected waveform record $\{Y_{2i}\}$ is applied to the filter 26, the filter 26 provides an output digital word $Y_{2j}'$ equal to the sum over values of p from 0 to M of the terms $$k_p Y_{2,j-p}$$

For suitable values of $k_p$, these digital words represent a delayed version of the selected waveform record, i.e. the effect of passing the record $\{Y_{2i}\}$ through the FIR filter is to produce a signal $\{Y_{2i}'\}$ of which the waveform in the analog domain is the same as that of the record $\{Y_{2i}\}$ but of which the sampling points have been delayed with respect to those of the record $\{Y_{2i}\}$. The amount of the delay depends on the values of $k_p$. The digital signal $\{Y_{2i}'\}$ generated by the FIR filter 26 is applied to one input of a subtraction circuit 42.

As the record $\{Y_{2i}\}$ is read from the memory portion 18B, the reference record $\{Y_{1i}\}$ is read from the memory portion 18A and the resulting reference signal is applied to the other input of the subtraction circuit 42. However, the addresses that are applied to the memory portion 18A are each one LSB less than those applied to the memory portion 18B, with result that the reference signal is delayed by one clock period. This one LSB offset is imposed by an offset circuit 66 under control of the processor 40. Therefore, when the subtraction circuit 42 receives the digital word $Y_{2j}'$ from the FIR filter, it receives the digital word $Y_{1,j-1}$ from the memory portion 18A and provides an output digital word $z_j$ representing the difference between the digital word $Y_{1,j-1}$ of the reference record and the corresponding digital word $Y_{2j}'$ of the delayed version of the selected waveform record. The digital word $z_j$ provided by the subtraction circuit is applied to a squaring circuit 44, to form the word $z_j^2$, and this word is applied to an accumulator 46 which forms the sum of the digital words $z_j^2$ for values of j from M+1 to N. The value accumulated by the accumulator is applied to the processor 40. The processor 40 executes an algorithm to adjust the factors $k_p$ following each accumulation in such a manner as to reduce the value stored in the accumulator. When the factors $k_p$ are such that the value accumulated in the accumulator 46 is a minimum, it implies that the power of the signal representing the difference between the reference record and the delayed version of the selected record is a minimum, and this in turn implies that relative jitter between the reference record and the delayed version $\{Y_{2i}'', i=M+1 \ldots N\}$ of the selected record has been corrected as far as practicable. As each corrected record is generated, it is written back into the memory portion 18B in lieu of the uncorrected version of the selected record.

Each record stored in the memory portion 18B is corrected in this manner and is replaced in the memory portion 18B by its corrected version. When all the records have been corrected, the corrected records and the reference record are applied to an averager 50 and the resulting averaged waveform record is stored in a waveform memory 52 and is used as the basis for measuring features of the video signal.

It is not necessary that the accumulator 46 store the output of the squaring circuit 42 for every pair of digital words. In the case where each record contains 910 digital words, good results can be obtained if the sum of the squares of about 500 words is accumulated, and satisfactory results can be obtained if the sum of the squares of at least 100 samples is generated. Since values of $Y_{2i}''$ are created only for values of i from $M+1$ to N, the first M words of the corrected record are lost. However, the disadvantage of losing approximately 1% of the corrected record is outweighed by the advantage of the jitter being removed rapidly and substantially completely.

By use of the apparatus shown in FIG. 1, it is possible to bring the waveform records into near perfect coincidence, i.e., coincidence to within substantially less than one sample interval. The reason for delaying the reference signal $\{Y_1\}$ by one clock period after coarse coincidence has been achieved is in order to make certain that fine coincidence can be achieved by only delaying the signal $\{Y_2\}$, so that it is not necessary to include advancing elements in the filter 26. Of course, the same result may be achieved by adding one LSB to the addresses applied to the memory portion 18B, so as to advance the signal $\{Y_2\}$ by one clock period before it is applied to the FIR filter.

Figure 3:
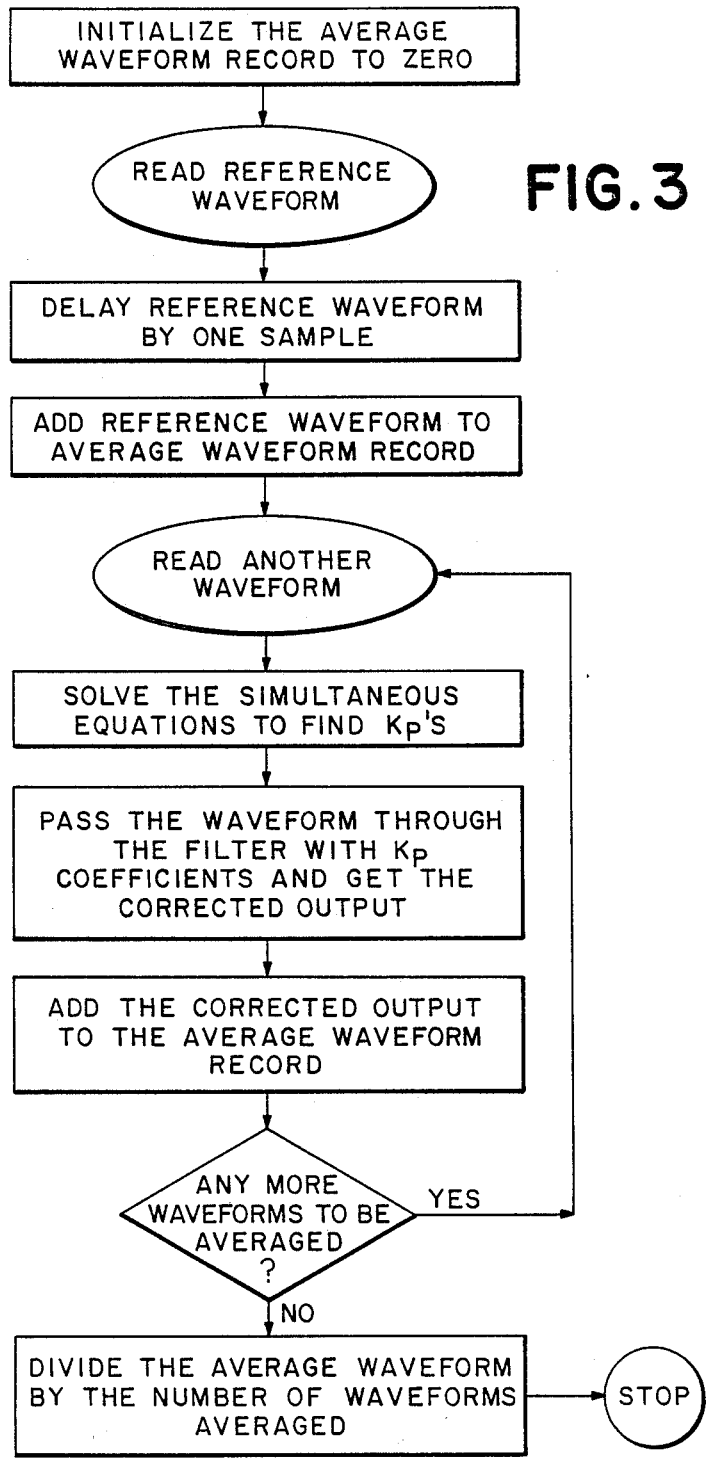
FIG. 3 is a flowchart that illustrates a method embodying the present invention.

It will be appreciated that the present invention is not restricted to the particular method and apparatus that have been described, and that variations may be made therein without departing from the scope of the invention as defined in the appended claims and equivalents thereof. For example, it is possible to implement the method of the invention without using dedicated hardware by employing a general purpose digital computer with appropriate software. The flow chart for a suitable program is illustrated in FIG. 3. The simultaneous equations that are referred to in the flowchart are $$\begin{bmatrix} \Sigma y_{qr}y_{qr} & \Sigma y_{qr}y_{q,r-1} & \cdots & \Sigma y_{qr}y_{q,r-M} \\ \Sigma y_{q,r-1}y_{qr} & \Sigma y_{q,r-1}y_{q,r-1} & \cdots & \cdot \\ \cdot & \cdot & \cdots & \cdot \\ \cdot & \cdot & \cdots & \cdot \\ \cdot & \cdot & \cdots & \cdot \\ \Sigma y_{q,r-M}y_{qr} & \Sigma y_{q,r-M}y_{q,r-1} & \cdots & \Sigma y_{q,r-M}y_{q,r-M} \end{bmatrix} \begin{bmatrix} k_0 \\ k_1 \\ \cdot \\ \cdot \\ \cdot \\ k_M \end{bmatrix} = \begin{bmatrix} \Sigma y_{1r}y_{qr} \\ \Sigma y_{1r}y_{q,r-1} \\ \cdot \\ \cdot \\ \cdot \\ \Sigma y_{1r}y_{q,r-M} \end{bmatrix}$$

where $\Sigma$ represents summation over values of r from M to $N-1$. It can be shown that these equations are susceptible of substantial simplification if it is assumed that the signal and noise are independent and that the noise is uncorrelated from sample to sample and from record to record. Of course, these same equations are solved implicitly in the hardware implementation.

It will be understood that when the invention is implemented using software, it is not necessary that the digital data be processed in precisely analogous manner to that represented in FIG. 1. For example, it is not necessary to form the group of multiplication products $Y_{2M}k_1, Y_{2,M-1}k_2, \ldots Y_{21}k_M$, in that order, form the sum of these products, and then form the next group of multiplication products $Y_{2,M+1}k_1, Y_{2M}k_2, \ldots Y_{22}k_M$ etc., since the products $Y_{21}k_1, Y_{21}k_2, Y_{21}k_3 \ldots Y_{21}k_M$, $Y_{22}k_1, Y_{22}k_2 \ldots Y_{22}k_M$ etc. may be formed and then summed in the desired groups. The operations that are performed when the invention is implemented using software do not result in the signals being actually delayed, but rather modified so that they appear to have been effectively delayed. Accordingly, references in the claims to a signal being shifted in time or being delayed are intended to cover not only actual shifts in time or actual delays but also effective shifts in time or effective delays.

In the case of the method described with reference to FIGS. 1 and 2, the clock generator is synchronized with reference to the repetitive input signal by triggering the clock generator from the horizontal sync pulse. In other applications, the clock pulses may be synchronized by both triggering the clock generator and initiating generation of the repetitive signal in response to the same event, and in yet other applications, the clock pulses and the repetitive input signal are asynchronous.

We claim:

1. A method of processing first and second waveform records representative of the waveforms of respective repetitions of a repetitive signal, comprising
   (a) reading the first waveform record from memory to form a reference signal,
   (b) reading the second waveform record from memory to form a second signal,
   (c) shifting the second signal in time by a selected amount,
   (d) determining the power of a difference signal representative of the difference in instantaneous magnitude between the time-shifted second signal and the reference signal, and
   (e) repeating steps (c) and (d) a plurality of times, using a different selected amount on each occasion, and determining which selected amount provides the smallest value for the power determined in step (d).

2. A method according to claim 1, comprising reading the first waveform record from memory in delayed relationship with respect to reading the second waveform record from memory, and step (c) comprises delaying the second signal.

3. A method according to claim 1, wherein step (d) comprises calculating the waveform of the difference signal and calculating the power of the difference signal having that waveform.

4. A method according to claim 1, further comprising:
   (f) writing a waveform record representative of the second signal, shifted in time by the amount determined in step (e), into memory.

5. A method according to claim 4, wherein step (f) comprises replacing the waveform record that was read in step (b) by the waveform record written in step (f).

6. A method of processing first and second waveform records representative of the waveforms of respective repetitions of a repetitive signal, comprising:
   (a) reading the first waveform record from memory to form a reference signal,
   (b) reading the second waveform record from memory to form a second signal, (c) shifting the second signal in time by a selected amount to form a time-shifted second signal, (d) forming a difference signal representative of the difference in instantaneous magnitude between the time shifted second signal and the reference signal, (e) determining the power of the difference signal, (f) repeating steps (c), (d) and (e) a plurality of times, using a different selected amount on each occasion, and determining which selected amount provides the smallest value for the power determined in step (e).

7. A method according to claim 6, wherein step (a) comprises reading the first waveform record from memory in delayed relationship with respect to reading the second waveform record from memory, and step (c) comprises delaying the second signal.

8. A method according to claim 7, wherein the second signal comprises a succession of digital words and the second signal is delayed by carrying out a finite impulse response filtering operation on the second signal.

9. A method according to claim 8, wherein the finite impulse response filtering operation is carried out by applying the second signal to a filter that comprises a plurality of delay elements connected in series, a summation circuit, a plurality of multipliers connected between the outputs of the delay elements and the summation circuit, and an additional multiplier connected between the input terminal of the filter and the summation circuit.

10. A method according to claim 6, wherein the reference signal comprises a first succession of digital words and the time-shifted second signal comprises a second succession of digital words, and wherein the difference signal comprises a third succession of digital words, each digital word of the third succession being representative of the difference in magnitude between a selected digital word of the first succession and a corresponding digital word of the second succession.

11. A method according to claim 10, comprising forming the sum of the squares of the digital words of the third succession of digital words.

12. A method according to claim 6, further comprising:

(g) writing a waveform record representative of the second signal, shifted in time by the amount determined in step (f), into memory.

13. A method according to claim 12, wherein step (g) comprises replacing the waveform record that was read in step (b) by the waveform record written in step (g).

14. Apparatus for processing a repetitive signal, comprising memory means for storing at least first and second waveform records, representative of the waveforms of first and second repetitions of the repetitive signal, output means for reading the first and second waveform records from the memory means to form a reference signal and a second signal respectively, means for shifting the second signal in time by a selected amount to form a time-shifted second signal, means for forming a difference signal representative of the difference in instantaneous magnitude between the time-shifted second signal and the reference signal, and means for determining the power of the difference signal.

15. A method of processing a repetitive signal, comprising (a) writing first and second waveform records representative of the waveforms of respective repetitions of the repetitive signal into memory, (b) reading the first waveform record from memory to form a reference signal, (c) reading the second waveform record from memory to form a second signal, (d) shifting the second signal in time by a selected amount, (e) determining the power of a difference signal representative of the difference in instantaneous magnitude between the time-shifted second signal and the reference signal (f) repeating steps (d) and (e) a plurality if times, using a different selected amount on each occasion, and determining which selected amount provides the smallest value for the power determined in step (e).

16. A method of processing a repetitive signal, comprising (a) writing first and second waveform records representative of the waveforms of respective repetitions of the repetitive signal into memory, (b) reading the first waveform record from memory to form a reference signal, (c) reading the second waveform record from memory to form a second signal, (d) shifting the second signal in time by a selected amount to form a time-shifted second signal, (e) forming a difference signal representative of the difference in instantaneous magnitude between the time-shifted second signal and the reference signal, (f) determining the power of the difference signal, (g) repeating steps (e) and (f) a plurality of times, using a different selected amount on each occasion, and determining which selected amount provides the smallest value for the power determined in step (f).

17. A method according to claim 16, wherein step (b) comprises reading the first waveform record from memory in delayed relationship with respect to reading the second waveform record from memory, and step (d) comprises delaying the second signal.

18. A method according to claim 17, wherein the second signal comprises a succession of digital words and the second signal is delayed by carrying out a finite impulse response filtering operation on the second signal.

19. A method according to claim 18, wherein the finite impulse response filtering operation is carried out by applying the second signal to a filter that comprises a plurality of delay elements connected in series, a summation circuit, a plurality of multipliers connected between the outputs of the delay elements and the summation circuit, and an additional multiplier connected between the input terminal of the filter and the summation circuit.

20. A method according to claim 16, wherein the reference signal comprises a first succession of digital words and the time-shifted second signal comprises a second succession of digital words, and wherein the difference signal comprises a third succession of digital words, each digital word of the third succession being representative of the difference in magnitude between a selected digital word of the first succession and a corresponding digital word of the second succession.

21. A method according to claim 20, comprising forming the sum of the squares of the digital words of the third succession of digital words.

* * * * *